(12) United States Patent
Kim

(10) Patent No.: US 9,876,162 B2
(45) Date of Patent: Jan. 23, 2018

(54) ELECTRONIC DEVICE INCLUDING A SEMICONDUCTOR MEMORY HAVING VARIABLE RESISTANCE STRUCTURE WITH MAGNETIC CORRECTION LAYER

(71) Applicant: SK hynix Inc., Icheon-Si (KR)

(72) Inventor: Keun-Jun Kim, Icheon-si (KR)

(73) Assignee: SK hynix Inc., Icheon-Si (KR)

( * ) Notice: Subject to any disclaimer, the term of this patent is extended or adjusted under 35 U.S.C. 154(b) by 0 days.

(21) Appl. No.: 15/048,035

(22) Filed: Feb. 19, 2016

(65) Prior Publication Data
US 2017/0025598 A1    Jan. 26, 2017

(30) Foreign Application Priority Data

Jul. 24, 2015  (KR) .................. 10-2015-0104876

(51) Int. Cl.
  *G11C 11/56*  (2006.01)
  *H01L 43/02*  (2006.01)
  *H01L 43/08*  (2006.01)
  *H01L 27/22*  (2006.01)
  *G06F 12/0868*  (2016.01)

(52) U.S. Cl.
  CPC ............ *H01L 43/02* (2013.01); *H01L 27/224* (2013.01); *H01L 43/08* (2013.01); *G06F 12/0868* (2013.01)

(58) Field of Classification Search
  CPC ....... H01L 43/02; H01L 27/224; H01L 43/08; G06F 12/0875; G06F 2212/451; G11C 11/02
  See application file for complete search history.

(56) References Cited

U.S. PATENT DOCUMENTS

| | | | |
|---|---|---|---|
| 2014/0042571 A1* | 2/2014 | Gan | H01L 43/02 257/421 |
| 2014/0250244 A1* | 9/2014 | Song | G06F 3/0673 710/5 |
| 2015/0092481 A1* | 4/2015 | Lee | H01L 43/08 365/158 |
| 2016/0118575 A1* | 4/2016 | Song | G06F 3/0673 711/104 |

FOREIGN PATENT DOCUMENTS

| KR | 10-2009-0005877 | 1/2009 |
|---|---|---|
| KR | 10-2015-0012511 | 2/2015 |

* cited by examiner

*Primary Examiner* — Khamdan Alrobaie
(74) *Attorney, Agent, or Firm* — Perkins Coie LLP

(57) ABSTRACT

This technology provides an electronic device. An electronic device in accordance with an implementation of this document includes a semiconductor memory, and the semiconductor memory may include a substrate; a plurality of structures formed over the substrate to be spaced apart from each other, each structure comprising a free layer having a variable magnetization direction, a pinned layer having a pinned magnetization direction, and a tunnel barrier layer interposed between the free layer and the pinned layer; and a magnetic correction layer formed adjacent to the plurality of structures and structured to reduce an influence to the free layer by a stray magnetic field generated by the pinned layer.

20 Claims, 8 Drawing Sheets

ELECTRONIC DEVICE INCLUDING A SEMICONDUCTOR MEMORY HAVING VARIABLE RESISTANCE STRUCTURE WITH MAGNETIC CORRECTION LAYER

CROSS-REFERENCE TO RELATED APPLICATION

This patent document claims priority of Korean Patent Application No. 10-2015-0104876 entitled "ELECTRONIC DEVICE AND METHOD FOR FABRICATING THE SAME" and filed on Jul. 24, 2015, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a characteristic switched between different resistant states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device, in which an electronic device includes a semiconductor memory which can improve characteristics of a variable resistance element and have a low level of difficulty of fabricating processes.

In one aspect, an electronic device may include a semiconductor memory, and the semiconductor memory may include: a substrate; a plurality of structures formed over the substrate to be spaced apart from each other, each structure comprising a free layer having a variable magnetization direction, a pinned layer having a pinned magnetization direction, and a tunnel barrier layer interposed between the free layer and the pinned layer; and a magnetic correction layer formed adjacent to the plurality of structures and structured to reduce an influence to the free layer by a stray magnetic field generated by the pinned layer.

Implementations of the above electronic device may include one or more the following.

The magnetic correction layer fills at least a portion of a space between the plurality of structures. The magnetization directions of the free layer, the pinned layer and the magnetic correction layer are substantially perpendicular to a surface of the substrate, and the magnetization direction of the pinned layer is anti-parallel to the magnetization direction of the magnetic correction layer. The semiconductor memory further comprises: a first insulating spacer layer interposed between each of the plurality of structures and the magnetic correction layer. The first insulating spacer layer is formed along a top surface and a side surface of each of the plurality of structures. The semiconductor memory further comprises: a second insulating spacer layer formed on a top surface of the magnetic correction layer. A top surface of the magnetic correction layer is at the same vertical level as the first insulating spacer layer formed on the top surface of the plurality of structures. A top surface of the magnetic correction layer is disposed lower than the first insulating spacer layer formed on the top surface of the plurality of structures. A top surface of the magnetic correction layer is positioned higher than the first insulating spacer layer. The semiconductor memory further comprises: a contact plug disposed over the plurality of structures and being coupled with each of the plurality of structures. The contact plug is insulated from the magnetic connection layer by a third insulating spacer layer formed on a sidewall of the contact plug. The semiconductor memory further comprises: a contact plug formed between the substrate and the plurality of structures such that the contact plug is coupled with a bottom surface of each of the plurality of structures and has a top surface greater than the bottom surface of each of the plurality of structures.

In another aspect, an electronic device may include a semiconductor memory, and the semiconductor memory may include: a substrate; variable resistance elements formed over the substrate and spaced apart from one another, each variable resistance element including a free magnetic layer, a pinned magnetic layer and a tunnel barrier layer interposed between the free magnetic layer and the pinned magnetic layer; a magnetic correction layer disposed adjacent to the variable resistance elements in a direction parallel to a surface of the magnetic correction layer and electrically isolated from the variable resistance elements, wherein the magnetic correction layer exhibits a magnetization direction which is opposite to a magnetization direction of the pinned magnetic layer to offset an influence of a magnetic field of the pinned magnetic layer to the free magnetic layer; and a first electrical insulation material formed between the variable resistance elements and the magnetic correction layer to insulate the magnetic correction layer from the resistance variable elements.

Implementations of the above electronic device may include one or more the following.

The magnetic correction layer is formed between the variable resistance elements to fill at least a portion of a space between the variable resistance elements. The semiconductor memory further comprises a first electrical contact plug that is in electrical contact with the variable resistance element under the variable resistance element; and a second electrical contact plug that is in electrical contact with the variable resistance element over the variable resistance element, wherein the first and second electrical contact plugs are configured to collectively provide the current flowing through the variable resistance element. The first electrical contact plug has a top surface with a greater width than a bottom surface of the variable resistance element. The second electrical contact plug has a bottom surface with a smaller width than a top surface of the variable resistance element.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In another aspect, a method for fabricating an electronic device including a semiconductor memory may include: forming a plurality of structures, each comprising a free layer having a variable magnetization direction, a pinned layer having a pinned magnetization direction, and a tunnel barrier layer interposed between the free layer and the pinned layer over a substrate; and forming a magnetic correction layer at least a portion of a space among the plurality of structures, the magnetic correction layer structured to produce a magnetization direction at the free layer in a direction opposite to a magnetization direction of a stray magnetic field produced by the pinned layer.

Implementations of the above method may include one or more the following.

The method claim further comprising, after the forming of the plurality of structures and before the forming of the magnetic correction layer: forming a first insulating spacer layer along a whole surface of a resultant structure in which the plurality of structures are formed. The forming of the magnetic correction layer comprises: forming a magnetic correction material over the first insulating spacer layer; and removing an upper portion of the magnetic correction material so as to expose a top portion of the first insulating spacer layer. The method further comprising, after the forming of the magnetic correction layer: forming a second insulating spacer layer covering a top surface of the magnetic correction layer. The forming of the magnetic correction layer is performed such that the magnetic correction layer is positioned over the first insulating spacer layer. The method further comprising, after the forming of the magnetic correction layers: forming a hole exposing a top surface of each of the plurality of structures by selectively etching the magnetic correction layer and the first insulating spacer layer over the plurality of structures; forming a third insulating spacer layer on a sidewall of the hole; and filling a remaining space of the hole with a conductive material.

These and other aspects, implementations and associated advantages are described in greater detail in the drawings, the description and the claims.

DETAILED DESCRIPTION

Figure 1A:
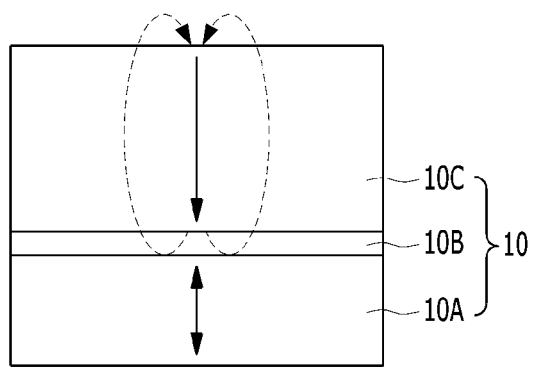
FIG. 1A is a cross-sectional view illustrating a variable resistance element of a comparative example.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 1B:
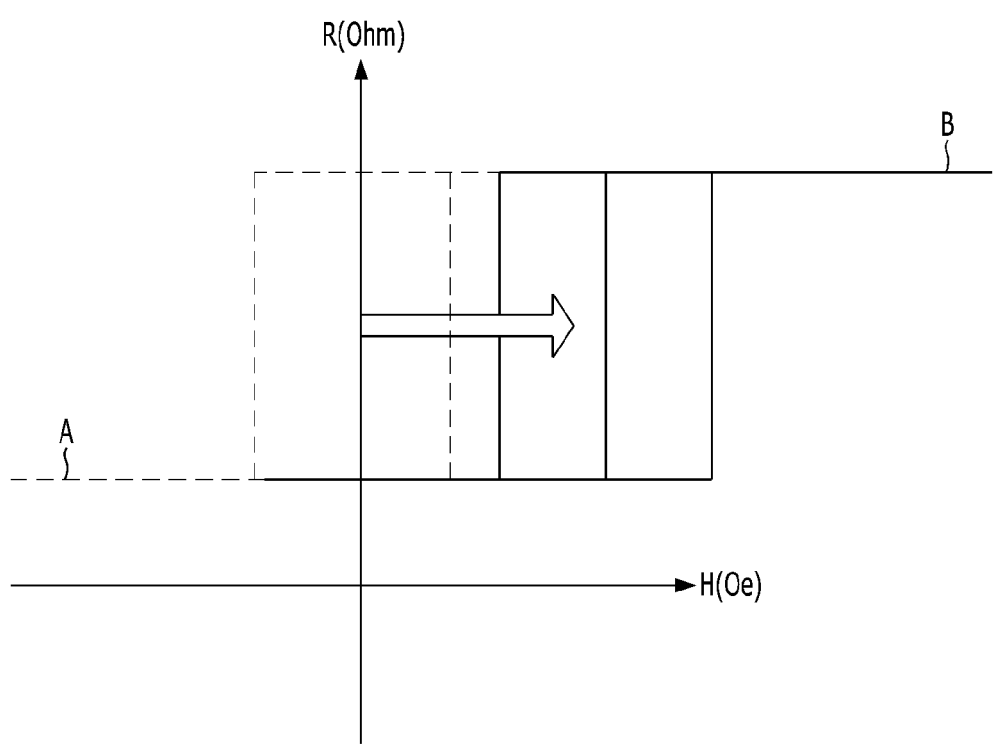
FIG. 1B is a diagram illustrating a magnetization curve of a free layer of FIG. 1A.

FIG. 1A is a cross-sectional view illustrating a variable resistance element of a comparative example, and FIG. 1B is a diagram illustrating a magnetization curve of a free layer of FIG. 1.

First, referring to FIG. 1A, a variable resistance element 10 in accordance with a comparative example may include a free layer 10A having a variable magnetization direction, a pinned layer 10C having a pinned magnetization direction, and a tunnel barrier layer 10B interposed between the free layer 10A and the pinned layer 10C.

Here, the free layer 10A and the pinned layer 10C may include a ferromagnetic material. As indicated by a solid arrow, magnetization directions of the free layer 10A and the pinned layer 10C may be perpendicular to top surfaces of the layers.

The tunnel barrier layer 10B may include an insulating oxide. The tunnel barrier layer 10B may serve to change the magnetization direction of the free layer 10A by tunneling of electrons during a data writing operation.

Data may be stored in the variable resistance element 10 by a method described below. A voltage or a current supplied through contact plugs (not shown) coupled with a lower end and an upper end of the variable resistance element 10. Accordingly, the magnetization direction of the free layer 10A may be changed so as to be parallel or anti-parallel to the magnetization direction of the pinned layer 10C. When the magnetization directions of the free layer 10A and the pinned layer 10C are parallel to each other, the variable resistance element 10 is in a low resistance state and may store, for example, data "1". On the contrary, when the magnetization directions of the free layer 10A and the pinned layer 10C are anti-parallel to each other, the variable resistance element 10 is in a high resistance state and may store, for example, data "0".

Meanwhile, a very strong stray magnetic field may be generated by the pinned layer 10C in the variable resistance element 10 as shown by a dashed arrow. Due to an influence of the stray magnetic field, a bias magnetic field may occur in the free layer 10A. This will be explained in detail with reference to FIG. 1B.

In FIG. 1B, the line A indicates a case that a bias magnetic field does not exist in the free layer 10A, and the line B indicates a case that a bias magnetic field exists in the free layer 10A.

Referring to FIG. 1B, when the bias magnetic field does not exist in the free layer 10A, a magnetization curve is symmetrical to a magnetization axis so that a switching from a low resistance state to a high resistance state and a switching from a high resistance state to a low resistance state may occur symmetrically.

On the other hand, due to the bias magnetic field of the free layer 10A, when a magnetization curve is moved toward one side, for example, the right side as shown by the arrow in FIG. 1B, a magnetization curve is no longer symmetrical to a magnetization axis. Thus, an asymmetric switching may occur, which deteriorates a switching characteristic of the variable resistance element.

As such, the switching characteristics of the variable resistance element 10 in accordance with the comparative example deteriorate due to an influence of a strong stray magnetic field generated in the pinned layer 10C.

In order to overcome the deterioration of the switching characteristics and provide other advantages, various implementations of the variable resistance element are discussed and presented below. The variable resistance element in accordance with some implementations of the present disclosure, it is possible to reduce a process cost and a process difficulty.

Figure 2A:
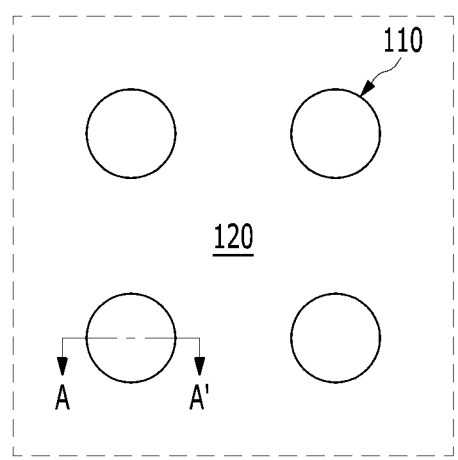
FIGS. 2A and 2B are a plan view and a cross-sectional view of an exemplary semiconductor device in accordance with an implementation of the present disclosure.
Figure 2B:
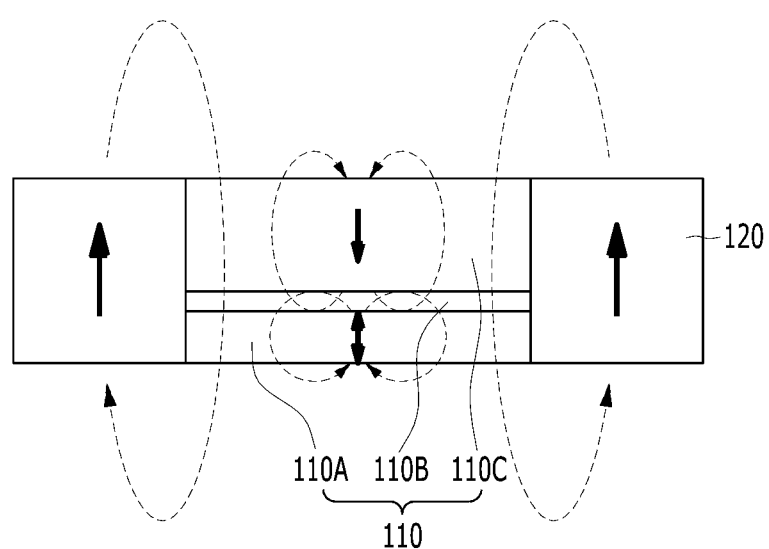

FIGS. 2A and 2B are a plan view and a cross-sectional view illustrating a semiconductor device in accordance with an implementation of the present disclosure. Specifically, FIG. 2B is a cross-sectional view taken along the line A-A'.

Referring to FIGS. 2A and 2B, a semiconductor device in accordance with an implementation of the present disclosure may include a plurality of MTJ (Magnetic Tunnel Junction) structures 110, and a magnetic correction layer 120. The plurality of MTJ structures 110 are arranged to be spaced apart from one another. The magnetic correction layer may be positioned adjacent to or between the MTJ structures. In some implementations, the magnetic correction layer may fill a space between the MTJ structures 110 and further surround sidewalls of each MTJ structure 110. The plurality of MTJ structures 110 may be arranged in a matrix form along a first direction parallel to the line A-A' and a second direction crossing the first direction.

Here, each MTJ structure 110 may include a free layer 110A having a variable magnetization direction, a pinned layer 110C having a pinned magnetization direction, and a tunnel barrier layer 110B interposed between the free layer 110A and the pinned layer 110C.

Magnetization directions of the free layer 110A and the pinned layer 110C may be perpendicular to top surfaces of the layers, as indicated by solid arrows. That is, the magnetization direction of the free layer 110A may be switched between a downward direction and an upward direction, and the magnetization direction of the pinned layer 110C may be fixed to a downward direction. However, unlike the implementation of FIGS. 2A and 2B, the magnetization direction of the pinned layer 110C may be fixed to an upward direction. Also, positions of the free layer 110A and the pinned layer 110C may be changed with each other. That is, unlike the implementation of FIGS. 2A and 2B, the free layer 110A may be disposed over the pinned layer 110C. The free layer 110A and the pinned layer 110C may have a single-layered structure or a multi-layered structure including a ferromagnetic material. The ferromagnetic material may include an alloy including a component of Fe, Ni or Co, such as a Co—Fe—B alloy, an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, an Fe—Pd alloy, a Co—Pd alloy, a Co—Pt alloy, an Fe—Ni—Pt alloy, a Co—Fe—Pt alloy, or a Co—Ni—Pt alloy, etc.

The tunnel barrier layer 110B may include an insulating oxide, for example, MgO, CaO, SrO, TiO, VO, or NbO, etc. The tunnel barrier layer 110B may change the magnetization direction of the free layer 110A by tunneling electrons during a data writing operation.

As discussed above, in the MTJ structure 110, data may be stored by changing the magnetic directions of the layers of the MTJ structure. According to a voltage or a current applied to a lower end and an upper end of the MTJ structure 110, the magnetization direction of the free layer 110A may be changed so as to be parallel or anti-parallel to the magnetization direction of the pinned layer 110C. Specifically, the magnetization direction of the free layer 110A may be changed by spin transfer torque due to a current passing through the MTJ structure 110. When the magnetization directions of the free layer 110A and the pinned layer 110C are parallel to each other, the MTJ structure 110 may be in a low resistance state so as to store, for example, data '1'. On the contrary, when the magnetization directions of the free layer 110A and the pinned layer 110C are anti-parallel to each other, the MTJ structure 110 may be in a high resistance state so as to store, for example, data '0'.

Furthermore, in addition to the free layer 110A, the tunnel barrier layer 110B and the pinned layer 110C, the MTJ structure 110 may further include additional layers (not shown) which functions to improve various characteristics required for the MTJ structure 110 and facilitate a process. This will be explained later with reference to FIGS. 3A to 3C.

Referring to FIB. 2B, since the free layer 110A and the pinned layer 110C include a ferromagnetic material, a magnetic field may be generated as shown by a dashed arrow. Specifically, the pinned layer 110C having a pinned magnetization direction may cause a very strong stray magnetic field, and thus a bias magnetic field may be generated in the free layer 110A by an influence of the stray magnetic field. It has been already explained with regard to FIG. 1B that the bias magnetic field in the free layer 110A may deteriorate a switching characteristic. In this implementation, the magnetic correction layer 120 may be formed to lessen or solve this problem.

The magnetic correction layer 120 may be formed so as to fill or cover a space in which the MTJ structure 110 is not formed. As such, sidewalls of each MTJ structure 110 may be surrounded by the magnetic correction layer 120. However, although it is not shown, an insulating material may be interposed between the MTJ structure 110 and the magnetic correction layer 120 for electrical insulation.

The magnetic correction layer 120 may have a magnetization direction anti-parallel to the magnetization direction of the pinned layer 110C as shown by a solid arrow in FIG. 2b. A magnetic field generated by the magnetic correction layer 120 is indicated by a dashed arrow. Referring to the dashed arrow, it may be shown that the magnetic field generated by the magnetic correction layer 120 reduces or offsets an influence of the magnetic field generated by the pinned layer 110C. Therefore, an influence of the magnetic field of the pinned layer 110C on the free layer 110A may be reduced and thus, a bias magnetic field in the free layer 110A may be reduced or eliminated so as to improve a switching characteristic of the MTJ structure 110.

Although in this implementation, the magnetic correction layer 120 has the same thickness as that of the MTJ structure 110, the present disclosure is not limited thereto. According to a process method, the magnetic correction layer 120 may be positioned at the same level as the MTJ structure 110 in a vertical direction but have a different thickness from that of the MTJ structure 110. This will be exemplarily explained with reference to FIGS. 3A to 5.

Figure 3A:
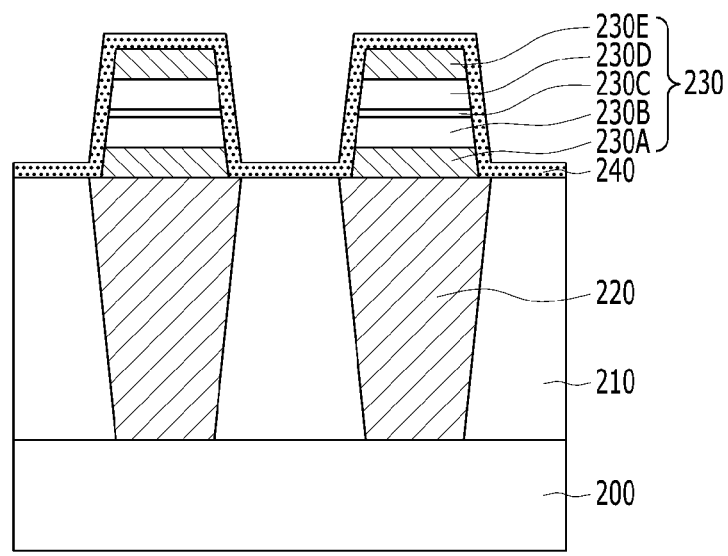
FIGS. 3A through 3C are cross-sectional views of an exemplary semiconductor device in accordance with another implementation of the present disclosure.
Figure 3B:
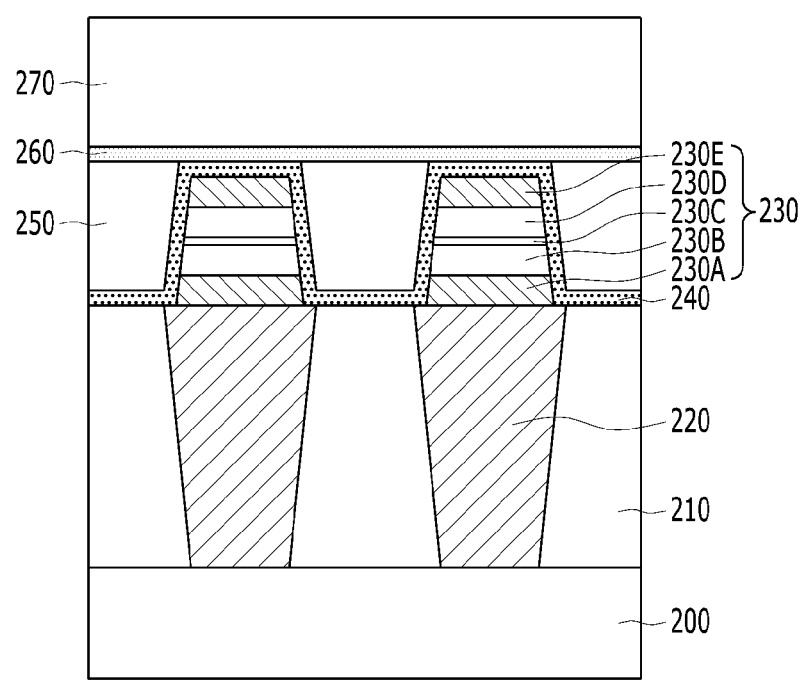
Figure 3C:
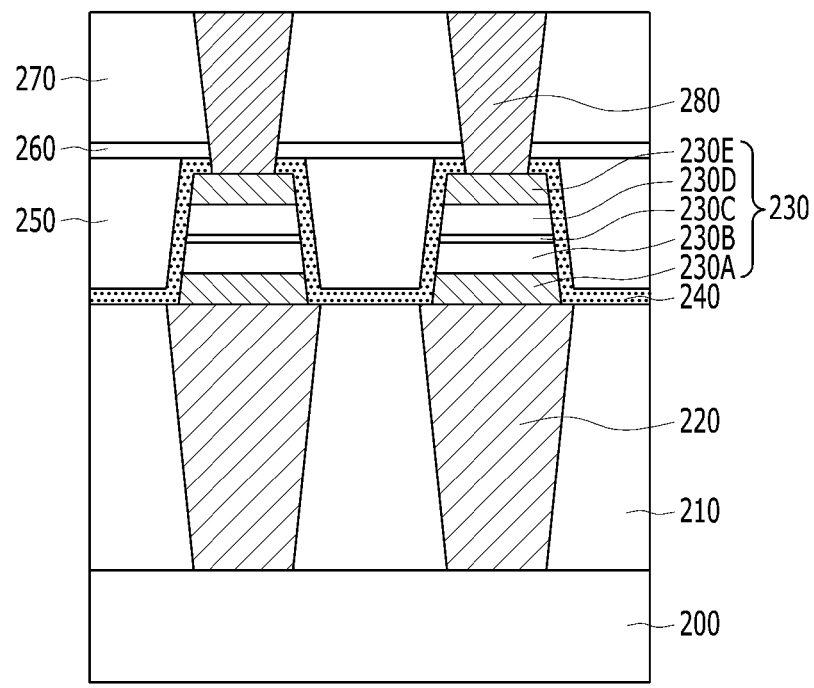

FIGS. 3A to 3C are cross-sectional views of an exemplary semiconductor device and a method for fabricating the same in accordance with another implementation of the present disclosure. Differences from the implementation of FIGS. 2A and 2B will be mainly described.

Referring to FIG. 3A, a substrate 200 may be provided. The substrate 200 may be or include a structure including various elements, lines, insulating layers, etc. which are required, for example, a switching element (not shown). Here, one end of the switching element may be coupled with a lower end of an MTJ structure 230 through a lower contact plug 220. The switching element may serve to control the supply of a voltage or a current to the MTJ structure 230. For example, the switching element may be a transistor or a diode, etc. The other end of the switching element may be coupled with a certain line (not shown), for example, a source line.

Subsequently, a first interlayer dielectric layer 210 may be formed over the substrate 200. The first interlayer dielectric layer 210 may be formed of or include various insulating materials, such as silicon oxide, etc.

Then, the lower contact plug 220 which passes through the first interlayer dielectric layer 210 to be coupled with a portion of the substrate 200 may be formed. Specifically, the lower contact plug 220 may be formed by selectively etching the first interlayer dielectric layer 210 to form a hole exposing a portion of the substrate 200, depositing a conductive material to a sufficient thickness to fill the hole, and performing a planarization process, for example, a CMP (Chemical Mechanical Polishing) process until a top surface of the first interlayer dielectric layer 210 is exposed. The lower contact plug 220 may be formed of or include various conductive materials. In particular, the lower contact plug 220 may include a conductive material having a superior filling characteristic and a high conductivity, for example, a metal such as tungsten (W), tantalum (Ta), etc., metal nitride such as titanium nitride (TiN), etc., or a combination thereof.

Subsequently, the MTJ structure of which a lower end is coupled with the lower contact plug 220 may be formed by depositing material layers for the MTJ structure 230 over the first interlayer dielectric layer 210 and the lower contact plug 220 and selectively etching the material layers.

Here, the MTJ structure 230 may include an under layer 230A, a free layer 230B, a tunnel barrier layer 230C, a pinned layer 230D and a capping layer 230E. The free layer 230B, the tunnel barrier layer 230C and the pinned layer 230D may correspond to the free layer 110A, the tunnel barrier layer 110B and the pinned layer 110C shown in FIG. 1, respectively. Positions of the free layer 230B and the pinned layer 230D may be exchanged or swamped with each other. The under layer 230A may include various conductive materials and perform various functions including increasing adhesion between a layer disposed over the under layer 230A, for example, the free layer 230B and the contact plug 220, or improving a layer quality such as crystallinity, roughness, etc. of the layer disposed over the under layer 230A. The capping layer 230E may serve to protect layers disposed under the capping layer 230E during the patterning of the MTJ structure 230 and include various conductive materials.

The MTJ structure 230 and the lower contact plug 220 may overlap with each other. Further, in a horizontal direction perpendicular to a surface of the substrate 200, a width of a top surface of the lower contact plug 220 may be greater than that of a bottom surface of the MTJ structure 230. In this case, since the MTJ structure 230 is positioned over the lower contact plug 220 having a planar top surface, it is possible to prevent bending of a layer of the MTJ structure 230, specifically, the tunnel barrier layer 230C. When the tunnel barrier layer 230C is bent, characteristics of the MTJ structure 230 may deteriorate due to Neel coupling, etc. However, in accordance with this implementation, it is possible to prevent such problems.

Subsequently, a first insulating spacer layer 240 may be formed along a whole surface of a resultant structure in which the MTJ structure 230 is formed. The first insulating spacer layer 240 may include an insulating material such as silicon oxide, silicon nitride or a combination thereof. The first insulating spacer layer 240 may serve to insulate the MTJ structure 230 from a magnetic correction layer which will be described below. When a width of the lower contact plug 220 is greater than that of the MTJ structure 230 such that a portion of the lower contact plug 220 is exposed, the first insulating spacer layer 240 may also serve to insulate the lower contact plug 220 from the magnetic correction layer.

Referring to FIG. 3B, a material layer for the magnetic correction layer 250 may be deposited over a resultant structure of FIG. 3A and a planarization process may be performed until a top portion of the magnetic correction layer 250 is exposed. As a result, the magnetic correction layer 250 may be formed to be positioned between the MTJ structures 230. In some implementations, the magnetic correction layer 250 may fill a space between the MTJ structures 230 and further surround sidewalls of each MTJ structure 230. The magnetic correction layer 250 may correspond to the magnetic correction layer 120 of FIGS. 2A and 2B.

Subsequently, a second insulating spacer layer 260 may be formed over the first insulating spacer layer 240 and the magnetic correction layer 250 having a planarized top surface. The second insulating spacer layer 260 may include various insulating materials such as silicon oxide, silicon nitride or a combination thereof. The second insulating spacer layer 260 may protect the top surface of the magnetic correction layer 250 and prevent undesired electrical short between the magnetic correction layer 250 and any structures disposed over the magnetic correction layer 250.

Then, a second interlayer dielectric layer 270 may be formed over the second insulating spacer layer 260. The second interlayer dielectric layer 270 may be formed of or include an insulating material having a different etch rate from that of the second insulating spacer layer 260. For example, when the second insulating spacer layer 260 is formed of or includes silicon nitride, the second interlayer dielectric layer 270 may be formed of or include silicon oxide.

Referring to FIG. 3C, an upper contact plug 280 may be formed to be coupled with a top surface of the MTJ structure 230. The upper contact plug 280 may be formed by selectively etching the second interlayer dielectric layer 270, the second insulating spacer layer 260 and the first insulating spacer layer 240 to form a hole exposing the top surface of the MTJ structure 230 and filling the hole with a conductive material. When etch rates of the second interlayer dielectric layer 270 and the second insulating spacer layer 260 are different from each other, the second insulating spacer layer 260 may be used as an etch stop layer during the etching the second interlayer dielectric layer 270 so as to facilitate process control.

Here, while the upper contact plug 280 may overlap with the MTJ structure 230, the upper contact plug 280 may have a bottom surface with a smaller width in a horizontal direction than that of a top surface of the MTJ structure 230. In this case, when a position of the upper contact plug 280 deviates from a desired position, it is possible to reduce a possibility of undesired electrical short with the magnetic correction layer 250.

The semiconductor device of FIG. 3C may be fabricated by the processes described above.

Again, referring to FIG. 3C, the magnetic correction layer 250 may be disposed between the MTJ structures 230 to cover or fill spaces defined by the first insulating spacer layer 240. However, in another implementation, the magnetic correction layer 250 may be formed to fill a portion of a space defined by the first insulating spacer layer 240. Alternatively, the magnetic correction layer 250 may exist between the MTJ structures 230 and over the MTJ structures 230. This will be exemplarily explained with reference to FIGS. 4 and 5.

Figure 4:
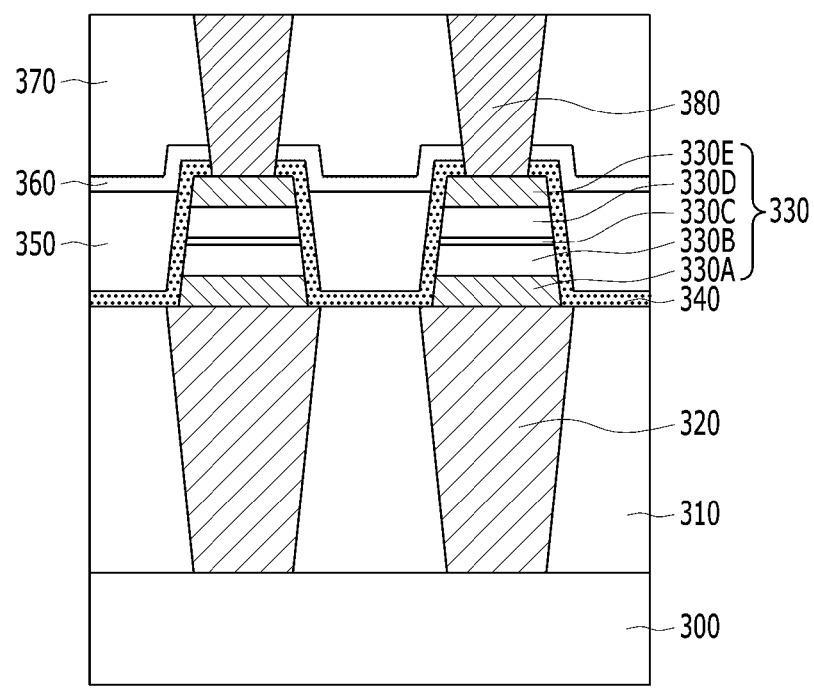
FIG. 4 is a cross sectional view of an exemplary semiconductor device in accordance with yet another implementation of the present disclosure.

FIG. 4 is a cross sectional view illustrating a semiconductor device and a method for fabricating the same in accordance with yet another implementation of the present disclosure. Differences from the implementation of FIGS. 3A to 3C will be mainly described.

Referring to FIG. 4, a lower contact plug 320 may be formed over the substrate 300 such that the lower contact plug 320 is coupled with a portion of a substrate 300 and passing through a first interlayer dielectric layer 310.

Subsequently, after forming an MTJ structure 330 in which a under layer 330A, a free layer 330B, a tunnel barrier layer 330C, a pinned layer 330D and a capping layer 330E are stacked over the first interlayer dielectric layer 310 and the lower contact plug 320, a first insulating spacer layer 340 may be formed along a whole surface of a resultant structure.

Then, a material layer for a magnetic correction layer 350 may be deposited over the first insulating spacer layer 340 and a top portion of the material layer may be removed by an etch-back process, etc. until a height of the material layer is lowered to a given degree from a top portion of the first insulating spacer layer 340. As a result, the magnetic correction layer 350 may be formed so as to fill or cover a portion of a space between the MTJ structures 330.

Subsequently, a second insulating spacer layer 360 may be formed over the first insulating spacer layer 340 and the magnetic correction layer 350 along a profile of the underlying structure of the second insulating spacer layer 360. Thus, the second insulating spacer layer 360 may have a bending or indented shape.

Then, a second interlayer dielectric layer 370 may be formed over the second insulating spacer layer 360. Further, an upper contact plug 380 may be formed passing through the second insulating spacer layer 360 and the first insulating spacer layer 340. The upper contact plug 380 may be coupled with a top surface of the MTJ structure 330.

Figure 5:
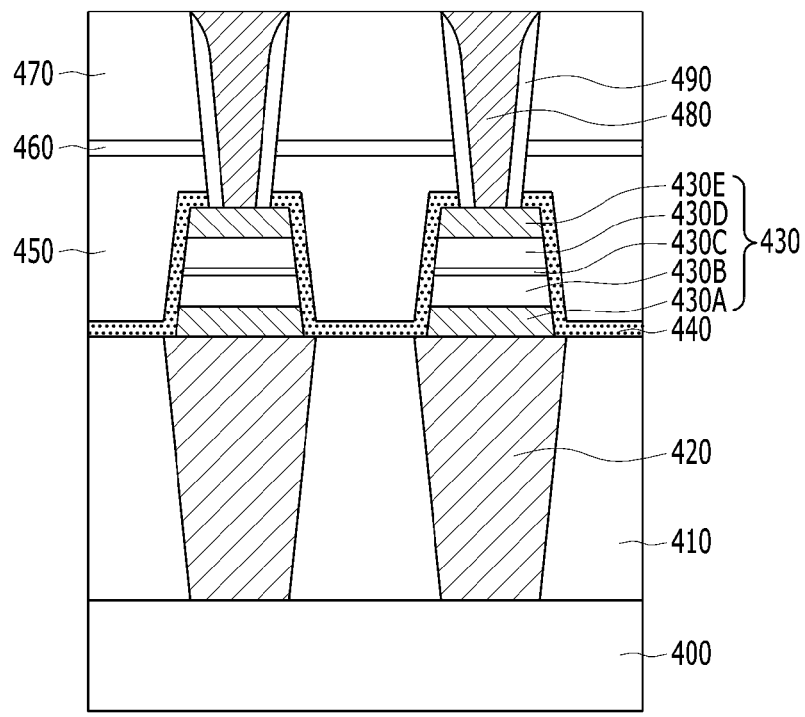
FIG. 5 is a cross sectional view of an exemplary semiconductor device in accordance with still another implementation of the present disclosure.

FIG. 5 is a cross sectional view illustrating a semiconductor device and a method for fabricating the same in accordance with still another implementation of the present disclosure. Differences from the implementation of FIGS. 3A to 3C will be mainly explained.

Referring to FIG. 5, a lower contact plug 420 may be formed over a substrate 400. The lower contact plug 420 pass through the first interlayer dielectric layer 410 and coupled with a portion of the substrate 400 may be formed over a substrate 400.

Subsequently, an MTJ structure 430 in which a under layer 430A, a free layer 430B, a tunnel barrier layer 430C, a pinned layer 430D and a capping layer 430E are stacked may be formed over the first interlayer dielectric layer 410 and the lower contact plug 420, and then a first insulating spacer layer 440 may be formed along a whole surface of a resultant structure.

Then, a material layer for a magnetic correction layer 450 may be deposited over the first insulating spacer layer 440. After depositing the material layer, a planarization process may be further performed in order to planarize a top surface of the magnetic correction layer 450. In any case, the magnetic correction layer 450 may be formed so as to be disposed over the first insulating spacer layer 440, thereby surrounding not only sidewalls of the MTJ structure 430 but also covering a top surface of the MTJ structure 430.

Subsequently, a second insulating spacer layer 460 and a second interlayer dielectric layer 470 may be formed over the magnetic correction layer 450.

Then, an upper contact plug 480 may be formed by selectively etching the second interlayer dielectric layer 470, the second insulating spacer layer 460, the magnetic correction layer 450 and the first insulating spacer layer 440 to form a hole exposing a top surface of the MTJ structure 430, forming a third insulating spacer layer 490 on sidewalls of the hole, and filling the hole in which the third insulating spacer layer 490 is formed with a conductive material. The third insulating spacer layer 490 may serve to insulate the magnetic correction layer 450 from the upper contact plug 480.

The semiconductor device and the method for fabricating the same in accordance with the implementations described above have advantages as follows.

First, since the magnetic correction layer operates to reduce or offset undesired influence of a stray magnetic field generated by the pinned layer, a symmetrical switching can be performed and thus, a switching characteristic can be improved.

Moreover, since the magnetic correction layer is formed separately from the MTJ structure, an etching thickness may be decreased during an etching process for forming the MTJ structure so that a difficulty of the etching process may be decreased.

Further, since the magnetic correction layer is formed between the MTJ structures, for example, so as to fill or cover a space between the MTJ structures, and additional masks or etching processes are not required, it is possible to reduce a process cost and a process difficulty.

According to the electronic device and the method for fabricating the same in accordance with the implementations described above, it is possible to facilitate a fabrication process and improve a characteristic of the variable resistance element.

The above and other memory circuits or semiconductor devices based on the disclosed technology can be used in a range of devices or systems. FIGS. 6-10 provide some examples of devices or systems that can implement the memory circuits disclosed herein.

Figure 6:
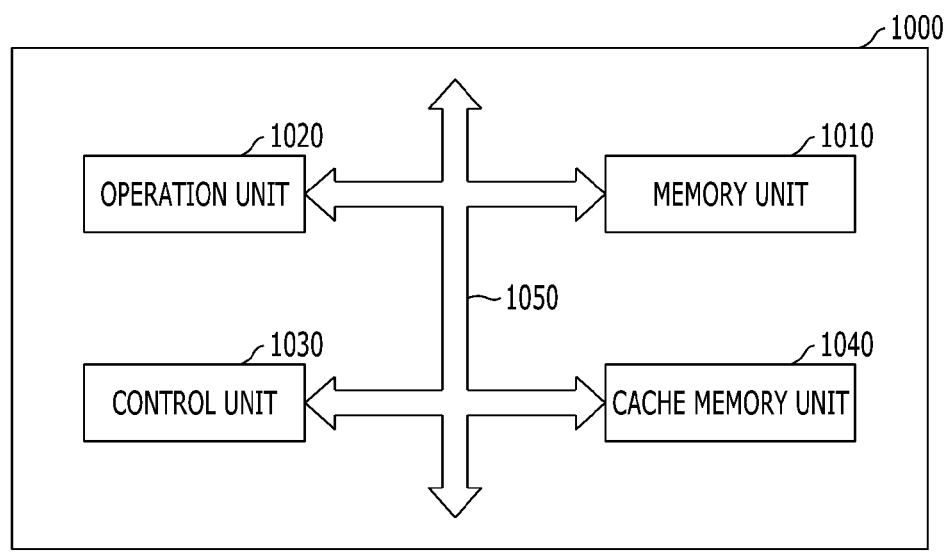
FIG. 6 is an example of configuration diagram of a microprocessor implementing memory circuitry based on the disclosed technology.

FIG. 6 is an example of configuration diagram of a microprocessor implementing memory circuitry based on the disclosed technology.

Referring to FIG. 6, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a substrate; a plurality of structures formed over the substrate to be spaced apart from each other, each structure comprising a free layer having a variable magnetization direction, a pinned layer having a pinned magnetization direction, and a tunnel barrier layer interposed between the free layer and the pinned layer; and a magnetic correction layer formed adjacent to the plurality of structures and structured to reduce an influence to the free layer by a stray magnetic field generated by the pinned layer. Through this, data storage characteristics of the memory unit 1010 may be improved and fabricating processes of the memory unit 1010 may be facilitated. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 7:
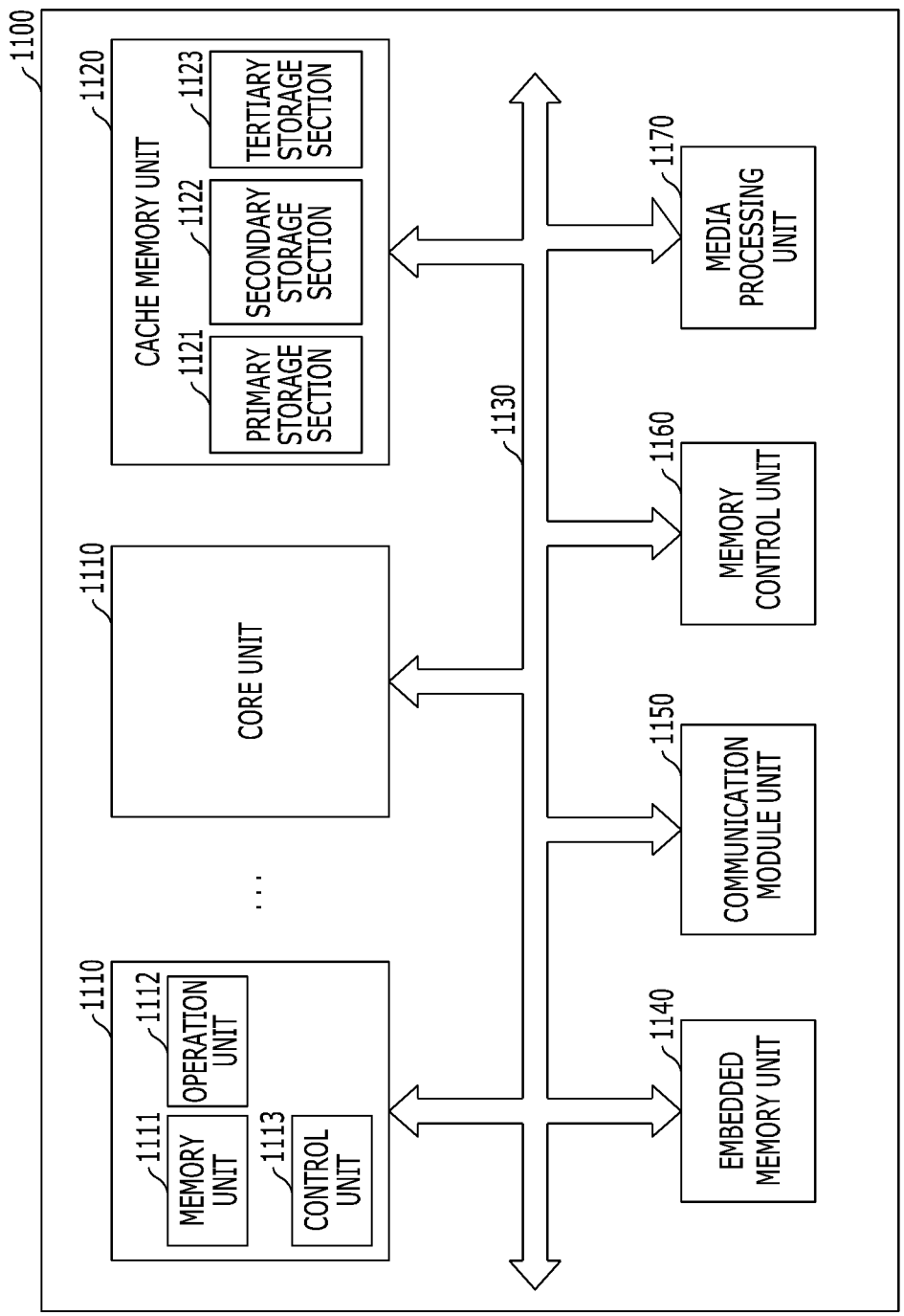
FIG. 7 is an example of configuration diagram of a processor implementing memory circuitry based on the disclosed technology.

FIG. 7 is an example of configuration diagram of a processor implementing memory circuitry based on the disclosed technology.

Referring to FIG. 7, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a substrate; a plurality of structures formed over the substrate to be spaced apart from each other, each structure comprising a free layer having a variable magnetization direction, a pinned layer having a pinned magnetization direction, and a tunnel barrier layer interposed between the free layer and the pinned layer; and a magnetic correction layer formed adjacent to the plurality of structures and structured to reduce an influence to the free layer by a stray magnetic field generated by the pinned layer. Through this, data storage characteristics of the cache memory unit 1120 may be improved and fabricating processes of the cache memory unit 1120 may be facilitated. As a consequence, operating characteristics of the processor 1100 may be improved.

Although it was shown in FIG. 7 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 8:
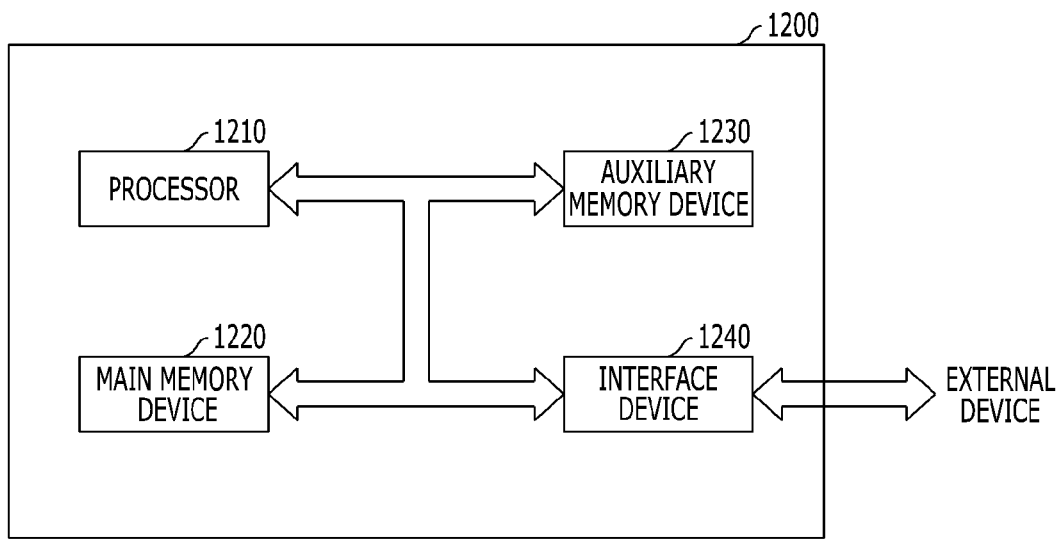
FIG. 8 is an example of configuration diagram of a system implementing memory circuitry based on the disclosed technology.

FIG. 8 is an example of configuration diagram of a system implementing memory circuitry based on the disclosed technology.

Referring to FIG. 8, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a substrate; a plurality of structures formed over the substrate to be spaced apart from each other, each structure comprising a free layer having a variable magnetization direction, a pinned layer having a pinned magnetization direction, and a tunnel barrier layer interposed between the free layer and the pinned layer; and a magnetic correction layer formed adjacent to the plurality of structures and structured to reduce an influence to the free layer by a stray magnetic field generated by the pinned layer. Through this, data storage characteristics of the main memory device 1220 may be improved and fabricating processes of the main memory device 1220 may be facilitated. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a substrate; a plurality of structures formed over the substrate to be spaced apart from each other, each structure comprising a free layer having a variable magnetization direction, a pinned layer having a pinned magnetization direction, and a tunnel barrier layer interposed between the free layer and the pinned layer; and a magnetic correction layer formed adjacent to the plurality of structures and structured to reduce an influence to the free layer by a stray magnetic field generated by the pinned layer. Through this, data storage characteristics of the auxiliary memory device 1230 may be improved and fabricating processes of the auxiliary memory device 1230 may be facilitated. As a consequence, operating characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MIVIC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 9:
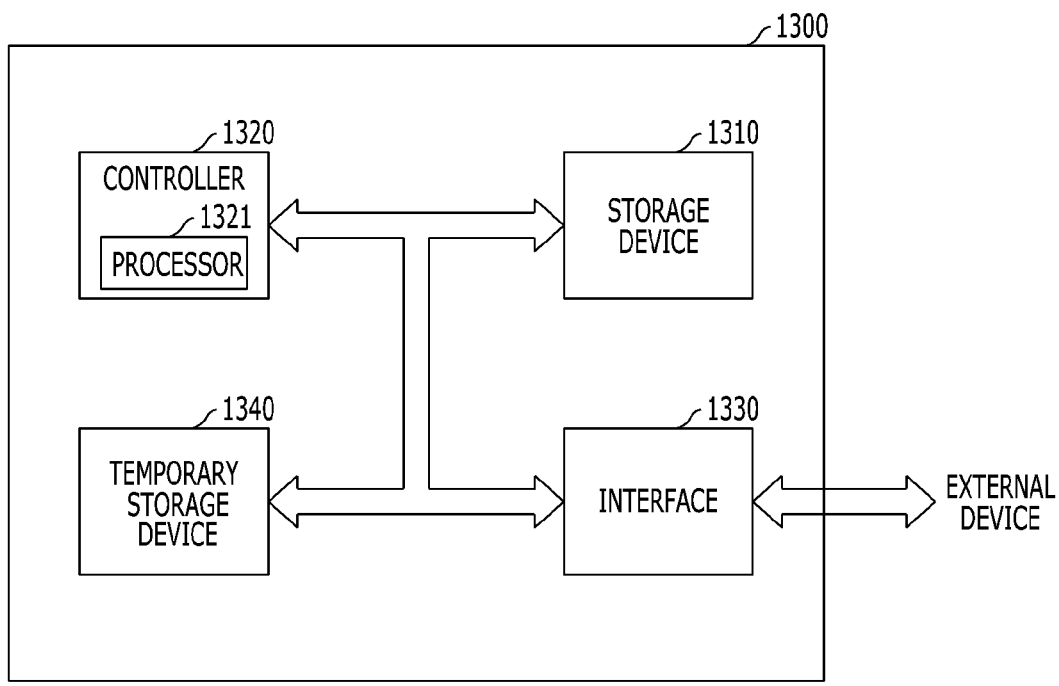
FIG. 9 is an example of configuration diagram of a data storage system implementing memory circuitry based on the disclosed technology.

FIG. 9 is an example of configuration diagram of a data storage system implementing memory circuitry based on the disclosed technology.

Referring to FIG. 9, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a substrate; a plurality of structures formed over the substrate to be spaced apart from each other, each structure comprising a free layer having a variable magnetization direction, a pinned layer having a pinned magnetization direction, and a tunnel barrier layer interposed between the free layer and the pinned layer; and a magnetic correction layer formed adjacent to the plurality of structures and structured to reduce an influence to the free layer by a stray magnetic field generated by the pinned layer. Through this, data storage characteristics of the storage device 1310 or the temporary storage device 1340 may be improved and fabricating processes may be facilitated. As a consequence, operating characteristics and data storage characteristics of the data storage system 1300 may be improved.

Figure 10:
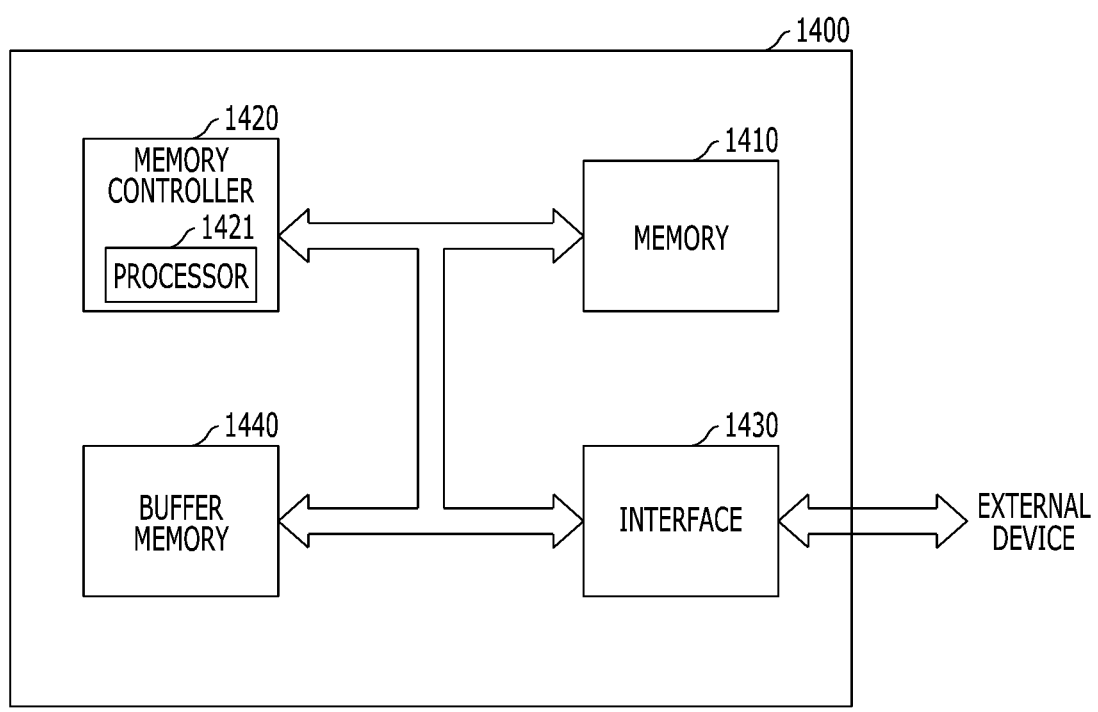
FIG. 10 is an example of configuration diagram of a memory system implementing memory circuitry based on the disclosed technology.

FIG. 10 is an example of configuration diagram of a memory system implementing memory circuitry based on the disclosed technology.

Referring to FIG. 10, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a substrate; a plurality of structures formed over the substrate to be spaced apart from each other, each structure comprising a free layer having a variable magnetization direction, a pinned layer having a pinned magnetization direction, and a tunnel barrier layer interposed between the free layer and the pinned layer; and a magnetic correction layer formed adjacent to the plurality of structures and structured to reduce an influence to the free layer by a stray magnetic field generated by the pinned layer. Through this, data storage characteristics of the memory 1410 may be improved and fabricating processes may be facilitated. As a consequence, operating characteristics and data storage characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a substrate; a plurality of structures formed over the substrate to be spaced apart from each other, each structure comprising a free layer having a variable magnetization direction, a pinned layer having a pinned magnetization direction, and a tunnel barrier layer interposed between the free layer and the pinned layer; and a magnetic correction layer formed adjacent to the plurality of structures and structured to reduce an influence to the free layer by a stray magnetic field generated by the pinned layer. Through this, data storage characteristics of the buffer memory 1440 may be improved and fabricating processes may be facilitated. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 6-10 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:
1. An electronic device comprising a semiconductor memory, wherein the semiconductor memory comprises:

a substrate;
a plurality of structures formed over the substrate to be spaced apart from each other, each structure comprising a free layer having a variable magnetization direction, a pinned layer having a pinned magnetization direction, and a tunnel barrier layer interposed between the free layer and the pinned layer; and
a magnetic correction layer formed to completely fill a space between the plurality of structures and structured to reduce an influence to the free layer by a stray magnetic field generated by the pinned layer.

2. The electronic device of claim 1, wherein the magnetization directions of the free layer, the pinned layer and the magnetic correction layer are perpendicular to a surface of the substrate, and
the magnetization direction of the pinned layer is antiparallel to the magnetization direction of the magnetic correction layer.

3. The electronic device of claim 1, wherein the semiconductor memory further comprises:
a first insulating spacer layer interposed between each of the plurality of structures and the magnetic correction layer.

4. The electronic device of claim 3, wherein the first insulating spacer layer is formed along a top surface and a side surface of each of the plurality of structures.

5. The electronic device of claim 3, wherein the semiconductor memory further comprises:
a second insulating spacer layer formed on a top surface of the magnetic correction layer.

6. The electronic device of claim 4, wherein a top surface of the magnetic correction layer is at the same vertical level as the first insulating spacer layer formed on the top surface of the plurality of structures.

7. The electronic device of claim 4, wherein a top surface of the magnetic correction layer is disposed lower than the first insulating spacer layer formed on the top surface of the plurality of structures.

8. The electronic device of claim 4, wherein a top surface of the magnetic correction layer is positioned higher than the first insulating spacer layer.

9. The electronic device of claim 1, wherein the semiconductor memory further comprises:
a contact plug disposed over the plurality of structures and being coupled with each of the plurality of structures.

10. The electronic device of claim 9, wherein the contact plug is insulated from the magnetic connection layer by a third insulating spacer layer formed on a sidewall of the contact plug.

11. The electronic device of claim 1, further comprising a contact plug formed between the substrate and the plurality of structures such that the contact plug is coupled with a bottom surface of each of the plurality of structures and has a top surface greater than the bottom surface of each of the plurality of structures.

12. The electronic device according to claim 1, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the semiconductor memory is part of the cache memory unit in the processor.

13. The electronic device according to claim 1, further comprising a processing system which includes:
a processor configured to decode a command received by the processor and control an operation for information based on a result of decoding the command;
an auxiliary memory device configured to store a program for decoding the command and the information;
a main memory device configured to call and store the program and the information from the auxiliary memory device such that the processor can perform the operation using the program and the information when executing the program; and
an interface device configured to perform communication between at least one of the processor, the auxiliary memory device and the main memory device and the outside,
wherein the semiconductor memory is part of the auxiliary memory device or the main memory device in the processing system.

14. The electronic device according to claim 1, further comprising a data storage system which includes:
a storage device configured to store data and conserve stored data regardless of power supply;
a controller configured to control input and output of data to and from the storage device according to a command inputted form an outside;
a temporary storage device configured to temporarily store data exchanged between the storage device and the outside; and
an interface configured to perform communication between at least one of the storage device, the controller and the temporary storage device and the outside,
wherein the semiconductor memory is part of the storage device or the temporary storage device in the data storage system.

15. An electronic device comprising a semiconductor memory, wherein the semiconductor memory comprises:
a first interlayer dielectric layer formed over a substrate;
variable resistance elements formed over the first interlayer dielectric layer and spaced apart from one another, each variable resistance element including a free magnetic layer, a pinned magnetic layer and a tunnel barrier layer interposed between the free magnetic layer and the pinned magnetic layer;
a magnetic correction layer disposed on the first interlayer dielectric layer to fill a space between the variable resistance elements and electrically isolated from the variable resistance elements, wherein the magnetic correction layer exhibits a magnetization direction which is opposite to a magnetization direction of the pinned magnetic layer to offset an influence of a magnetic field of the pinned magnetic layer to the free magnetic layer; and
a first electrical insulation material formed between the variable resistance elements and the magnetic correction layer to insulate the magnetic correction layer from the resistance variable elements, the first electrical insulation material positioned between the magnetic correction layer and the first interlayer dielectric layer.

16. The electronic device of claim 15, wherein the magnetic correction layer is formed between the variable resistance elements to fill at least a portion of a space between the variable resistance elements.

17. The electronic device of claim 15, further comprising:
a first electrical contact plug that is in electrical contact with the variable resistance element under the variable resistance element; and
a second electrical contact plug that is in electrical contact with the variable resistance element over the variable resistance element, wherein the first and second electrical contact plugs are configured to collectively provide the current flowing through the variable resistance element.

18. The electronic device of claim 17, wherein the first electrical contact plug has a top surface with a greater width than a bottom surface of the variable resistance element.

19. The electronic device of claim 17, wherein the second electrical contact plug has a bottom surface with a smaller width than a top surface of the variable resistance element.

20. The electronic device of claim 15, wherein the first electrical insulation material conformably covers a top surface of the first interlayer dielectric layer, and a top surface and side surfaces of the variable resistance elements.

* * * * *